United States Patent [19]

Ho

[11] Patent Number: 5,731,739
[45] Date of Patent: Mar. 24, 1998

[54] CLASS A OPERATIONAL AMPLIFIER WITH AREA EFFICIENT MOS CAPACITOR FREQUENCY COMPENSATION

[75] Inventor: David Seng Poh Ho, Singapore, Singapore

[73] Assignee: Tritech Microelectronics International Pte Ltd, Singapore, Singapore

[21] Appl. No.: 663,434

[22] Filed: Jun. 13, 1996

[51] Int. Cl.$^6$ ............................... H03F 3/45; H03F 1/14
[52] U.S. Cl. ............................................ 330/253; 330/292
[58] Field of Search ................................. 330/253, 255, 330/261, 292

[56] References Cited

U.S. PATENT DOCUMENTS

| 5,079,514 | 1/1992 | Mijuskovic | 330/292 X |
| 5,410,273 | 4/1995 | Brehmer et al. | 330/253 |
| 5,477,190 | 12/1995 | Brehmer et al. | 330/253 |

OTHER PUBLICATIONS

Ahuja, "Improved Frequency Compensation Techniques for CMOS Operational Amplifiers" IEEE Journal of Solid State Circuits, vol. SC-18, No. 6, pp. 76-80, Dec. 1983.
Chang et al, "Feed Forward Compensation Techniques for High Frequency CMOS Op-Amps" IEEE Journal of Solid State Circuits, vol. SC-25, No. 6, pp. 1590-1595, Dec. 1990.

Primary Examiner—Steven Mottola
Attorney, Agent, or Firm—George O. Saile; Stephen B. Ackerman

[57] ABSTRACT

An operational amplifier with MOSFET's configured as capacitors provide frequency compensation over a large range of input frequencies is described. The operational amplifier has an differential amplifier stage with an inverting and an noninverting input. The difference of signals placed at the inverting and the noninverting inputs are amplified and place at the input of a folded cascode amplifier stage. The output of the folded cascode amplifier stage is the input to a linear amplifier stage. The output of the linear amplifier stage is connected to external loading circuitry. A first frequency compensation capacitor is connected between the output of the linear amplifier stage and a noninverted input of the folded cascode amplifier. A second frequency compensation capacitor is connected between the output of the linear amplifier stage and a virtual ground within the folded cascode amplifier stage. A power distribution and biasing network provides a power supply voltage source, a ground reference potential, a substrate voltage source, and a plurality of biasing voltage sources to said differential amplifier stage, said folded cascode amplifier stage, and said linear amplifier stage. The plurality of biasing voltage sources are adjusted such that the first and second compensation capacitors are biased in the cutoff region.

9 Claims, 6 Drawing Sheets

CLASS A OPERATIONAL AMPLIFIER WITH AREA EFFICIENT MOS CAPACITOR FREQUENCY COMPENSATION

BACKGROUND OF THE INVENTION

1. Field of the Invention

This invention relates to the design of operational amplifiers and in particular to the portion of the design of said operational amplifiers that is involved with frequency compensation.

2. Description of Related Art

Operational amplifiers are one of the primary circuits used in the design of analog integrated circuits and are well understood in the art. The operational amplifier consists generally of a input stage, a buffering stage, and a driver stage that is capable of driving external load circuitry.

The input stage of an operational amplifier in a Metal Oxide Semiconductor Field Effect Transistor (MOSFET) integrated circuit is composed of two MOSFET's that have their sources connected together and connected to a current source. The gates of the two MOSFET's form the input to the operational amplifier. Each drain of the two MOSFET's form the outputs the input stage. The drain of one of the MOSFET's has a signal that is in phase and an amplified form of the difference of two signals that are presented to the input of the operational amplifier. The drain of the other MOSFET has a signal that is 180° out of phase with and an amplified form of the difference of the two signals that are present at the input of the operational amplifier.

The buffer stage is added to the input stage to increase the open loop gain and insure the symmetry of the signal presented to the output. A folded cascode buffer stage allows the output to have a large voltage swing. Since there is one high impedance node at the output, the gain bandwidth ($g_{bw}$) is determined:

$$g_{bw} = \frac{g_m}{c_l}.$$

where:

$g_m$ is transconductance of one of the input transistors of the input stage, and $c_l$ is the capacitance of the output of the folded cascode stage.

The output stage is generally a linear amplifier that is biased to operate in the class A or AB region of operation. The gain of the output stage is generally between 40 and 100.

FIGS. 4a and 4b show the gain 2000 and the phase margin 2010 of a CMOS operational amplifier without any compensation capacitors. The unity gain point 2020 has a phase margin that is greater than −180°. This is sufficient for the amplifier to become unstable and which may cause oscillation at this frequency.

This phenomena occurs because the dominant and secondary poles are not well spaced over the frequency of interest, which causes the amplifier to become unstable without any frequency compensation.

The most common form of frequency compensation is to have a feedback capacitor connected from the output of the output stage to the input. This form of compensation is commonly known as Miller compensation. However if this form of compensation will introduce distortion if capacitors formed from MOSFET's (MOSCAP's) are used due to the variation of capacitance with voltage across the MOSCAP. U.S. Pat. No. 5,410,273 (Brehmer et al.) teaches a design for a low distortion operational amplifier using MOSFET compensation capacitors reversed biased to reduce nonlinear effects of traditional compensation techniques.

Ahuja, "Improved Frequency Compensation Techniques For CMOS Operational Amplifiers," IEEE Journal of Solid State Circuits, Vol. SC-18, no. 6, pp 76–80, December 1983, describes a technique for compensation of operational amplifiers such that the operational amplifier has a stable operation over a much larger range of capacitive loads.

In conventional CMOS operational amplifier designs on a single polysilicon CMOS process, the compensation capacitors are fabricated using a first layer of metal as a first capacitor plate, a second layer of metal and a layer of polysilicon are connected form a second capacitor plate, and a layer of an insulating film such as silicon dioxide that is used to form the gate oxide for the MOSFET's forms the insulator between the first and second plates of the capacitor. This configuration has a very small capacitance per unit area and therefore, will occupy as much area or more area of the integrated circuit than the operational amplifier active circuitry. The capacitance of a MOSFET may be used, but the capacitance is dependent upon the voltage of the gate to bulk, drain, and source of the MOSFET. The area of a MOSFET capacitor is 20 to 50 times smaller than the area of a metal polycrystalline silicon capacitor having the same value of capacitance. FIG. 3 shows a plot of the capacitance 1040 of a MOSFET versus the gate to bulk voltage 1030. If the MOSFET is biased in the triode region 1000, the capacitance is fairly large. But if the voltage developed between the gate and the bulk of the MOSFET changes in value from the triode region to the saturation region 1010, the capacitance decrease very dramatically. It is only in the cut off region 1020 that the capacitance of the MOSFET is constant for a large change in gate to bulk voltage 1030. The size of this capacitance is determined by:

$$C = L_{eff} \times W \times C_{ox}$$

Where

Left is the effective length of the gate of the MOSFET

W is the width of the gate of the MOSFET $C_{ox}$ is the capacitance per unit area of the gate insulating material of the MOSFET.

FIGS. 5a and 5b illustrate the gain 3000 and the phase margin 3010 of an operational amplifier using a single MOSFET capacitor as compensation. The gain rises above the unity gain point at 3020 and the phase margin changes dramatically at point 3030. This makes the amplifier again unstable and could cause oscillation at the these frequencies.

SUMMARY OF THE INVENTION

An object of this invention is to provide frequency compensation for MOSFET operational amplifiers. Another object of this invention is to use the capacitance of a MOSFET to replace large area consuming capacitors implemented using layers of metal and polycrystalline silicon for frequency compensation capacitors. Still another object of this invention is to provide a method of compensation to keep the MOSFET in the cutoff region of operation, for large swings at the output so as to prevent distortion.

To accomplish the above objects, a folded cascode operational amplifier with MOS capacitor frequency compensation is described. The operational amplifier has a differential amplifier stage to amplify the difference in signal voltage levels present at an inverting input and a noninverting input and place the difference signal on an inverting output and a noninverting output. Connected to the inverting and noninverting outputs of the differential stage are inverted and noninverted inputs respectively of a folded cascode amplifier stage. Connected to an output of the folded cascode amplifier stage is the input of a linear amplifier stage which is biased as a class A or AB amplifier. The output of the linear amplifier stage is connected to an external load circuit.

A first compensation capacitor is connected between the output of the linear amplifier stage and the noninverted input of the folded cascode amplifier stage. A second compensation capacitor is connected between the output of the linear amplifier stage and a virtual ground connection within the folded cascode amplifier stage.

The first and second compensation capacitors are MOSFET capacitors biased to operate in the cutoff region, thus allowing large voltage swing at the output of the linear amplifier.

A power distribution and biasing network will provide a power supply voltage source, a ground reference potential, a substrate voltage source, and plurality of biasing voltage sources to the differential amplifier stage, the folded cascode amplifier stage and the linear amplifier stage.

DETAILED DESCRIPTION OF THE INVENTION

Figure 1:
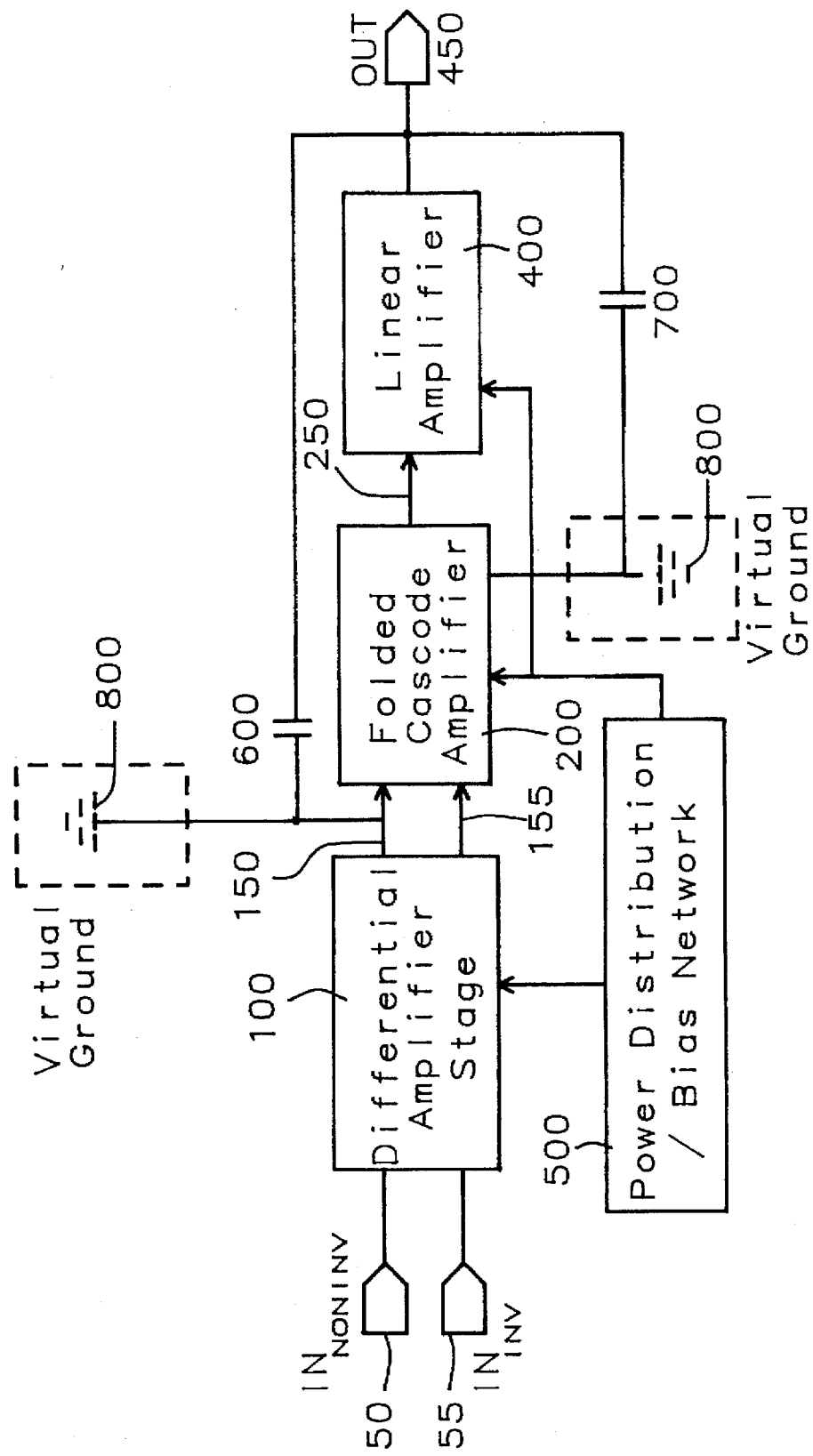
FIG. 1 is a block diagram of the operational amplifier of this invention.

Referring to FIG. 1, noninverting input 50 and inverting input 55 are connected to the differential amplifier stage 100. The noninverting output 150 and the inverting output 155 have signals that are the amplified difference of voltage signals present at the noninverting input 50 and the inverting input 55. The folded cascode amplifier stage 200 buffers and amplifies the signals at the inverting and noninverting output 150 155 of the differential amplifier stage 100. The output 250 of the folded cascode amplifier stage 200 is the input to the linear amplifier 400. The linear amplifier stage 400 is a class A or class AB amplifier that provides sufficient drive for external loads.

The frequency compensation is accomplished by placing a MOSCAP 900 between the output 450 of the linear amplifier stage 400 and the low impedance node 900 as well as placing a MOSCAP 600 between the output 450 to another low impedance node 150. Both nodes 150 and 900 are input to the folded cascade amplifier 200 and act as virtual grounds 800. This method of compensation is known in the art as a grounded Miller compensation as described in Ahuja, "Improved Frequency Compensation Techniques For CMOS Operational Amplifiers," IEEE Journal of Solid State Circuits, Vol. SC-18, no. 6, pp 76–80, December 1983.

Two capacitors 600 and 700 are used instead of one as described in Ahuja, "Improved Frequency Compensation Techniques For CMOS Operational Amplifiers," IEEE Journal of Solid State Circuits, Vol. SC-18, no. 6, pp 76–80, December 1983. The use of the two capacitors 600 and 700 improves the phase and gain margin of the operational amplifiers. The non-dominant pole at the output and the left half plane zeroes are pushed to higher frequencies with this configuration.

The frequency compensation capacitors 600 and 700 are MOSFET's. The gate of MOSFET that is the compensation capacitor 600 is connected to the output 450 of the linear amplifier stage 400. The source, drain, and bulk of said MOSFET are connected together and to the noninverting output 150 of the differential amplifier stage 100 that is also the input to the folded cascade amplifier 200. The source, drain, and bulk of the MOSFET that is the compensation capacitor 700 are connected together and to the output 450 of the linear amplifier stage 400. The gate of said MOSFET is connected to the node 900 connected to the folded cascade amplifier 200 that acts as a virtual ground 800.

The power distribution and biasing network 300 provides the power supply voltage, the ground reference potential, the substrate voltage supply, and the plurality of biasing voltages for the operational amplifier. The biasing voltages are adjusted to keep the MOSFET's that are the frequency compensation capacitor 600 700 biased in the cutoff region to allow a large voltage swing at the output 450.

Figure 2:
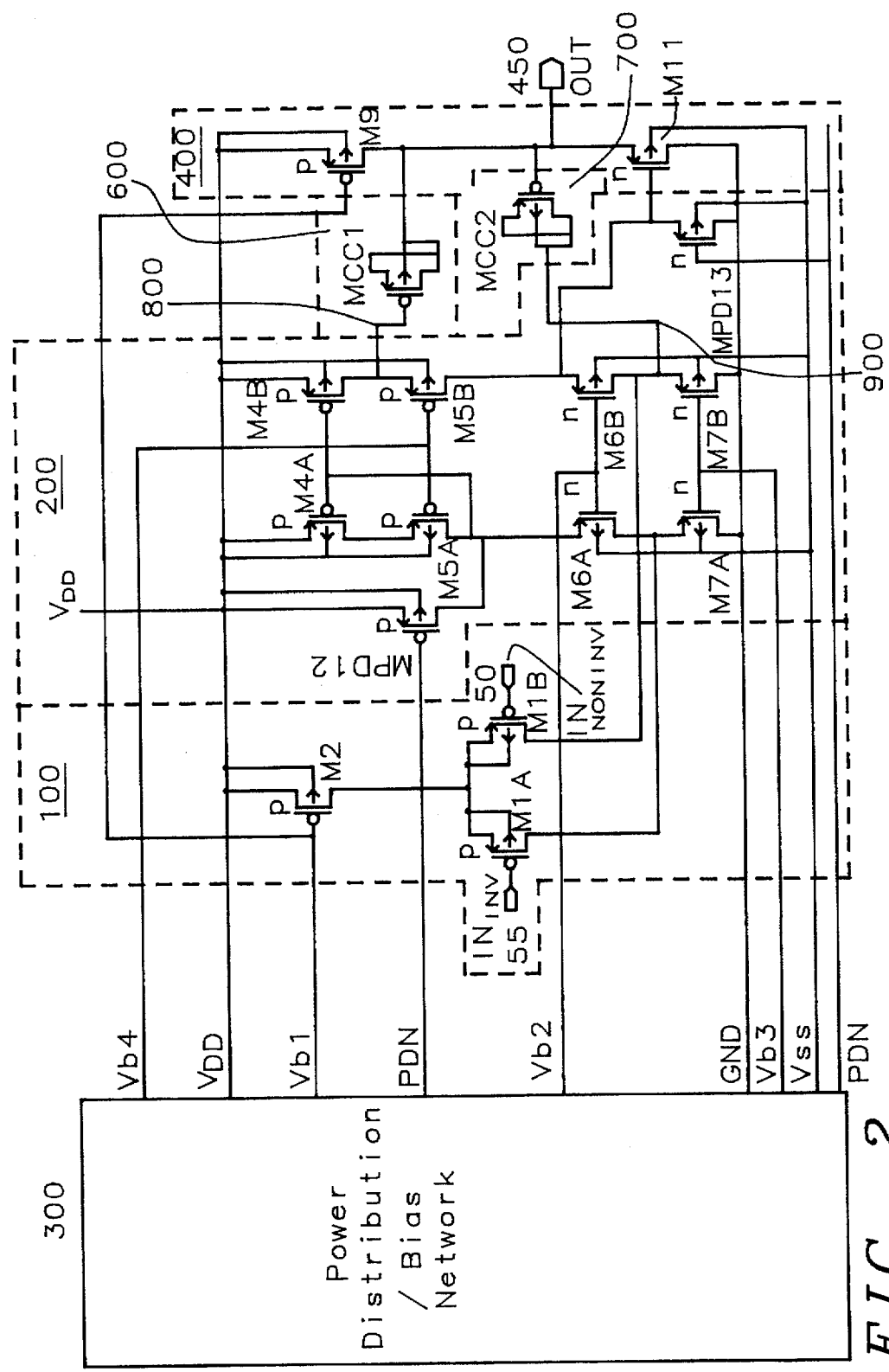
FIG. 2 is a schematic diagram of an implementation of the preferred embodiment of this invention.
Figure 3:
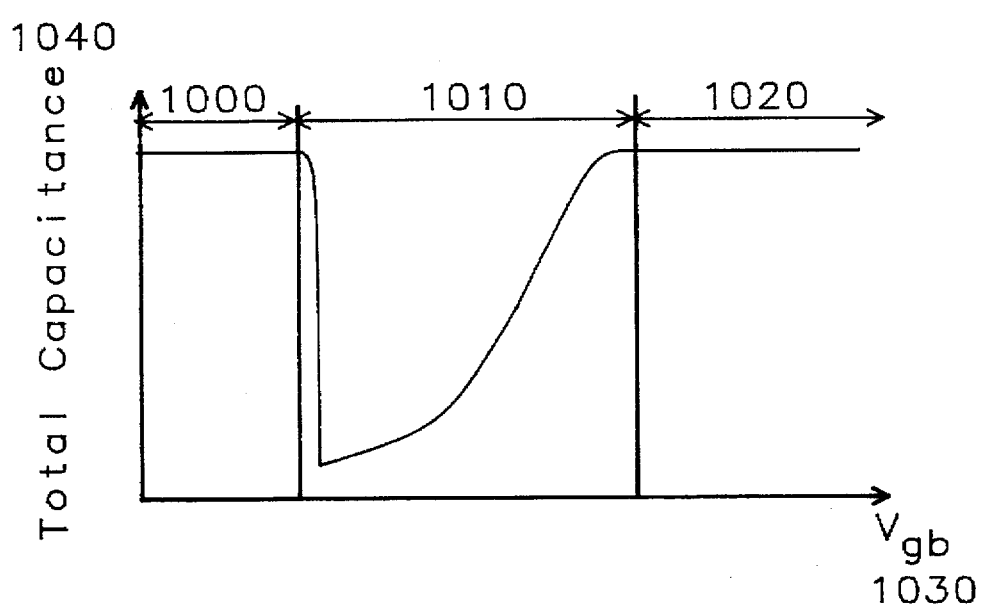
FIG. 3 is a plot of the capacitance versus the gate to bulk voltage of a MOSFET.
Figure 4A:
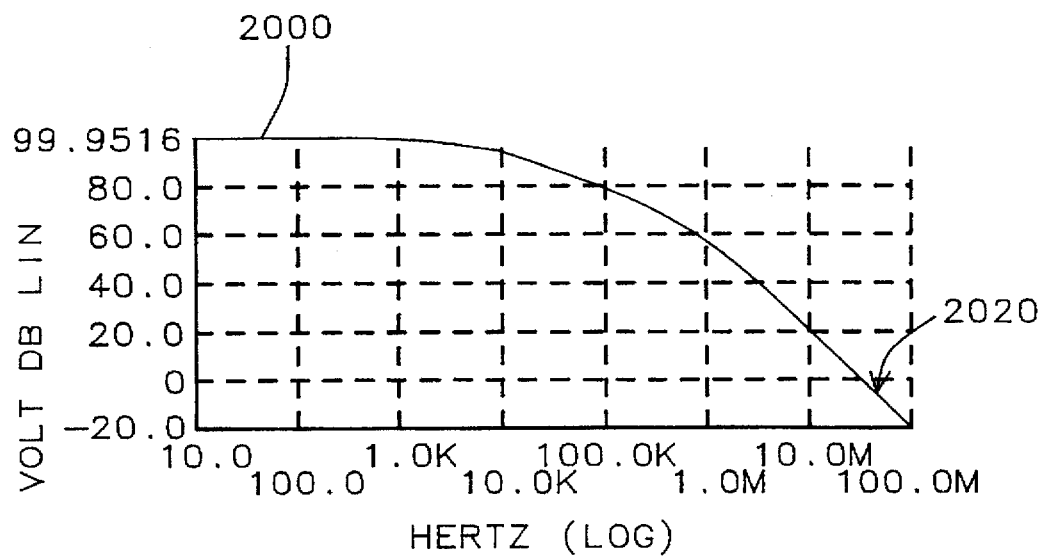
FIGS. 4a and 4b are plots of the gain and the phase margin of an operational amplifier with no frequency compensation.
Figure 4B:
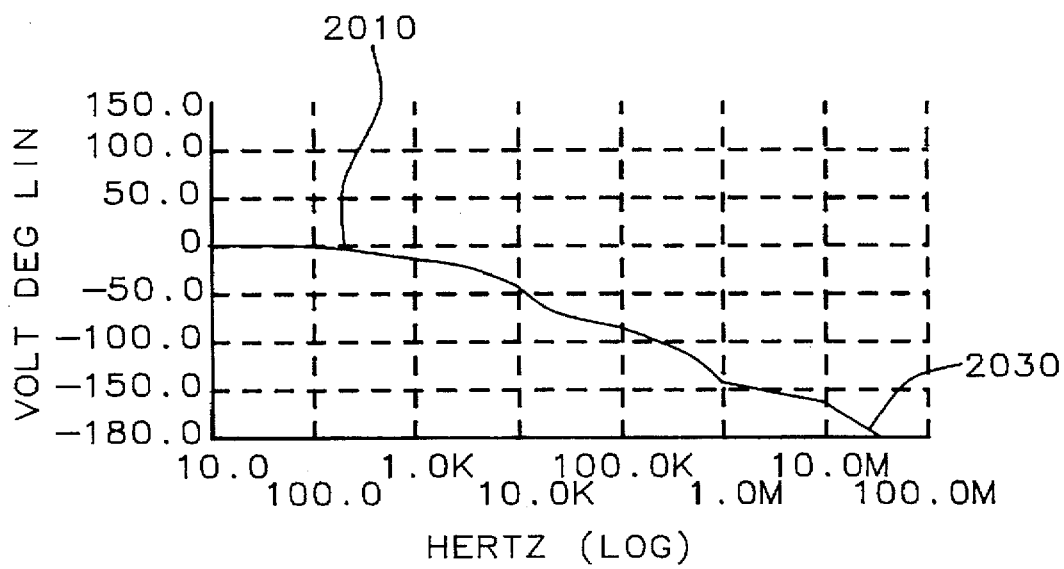
Figure 5A:
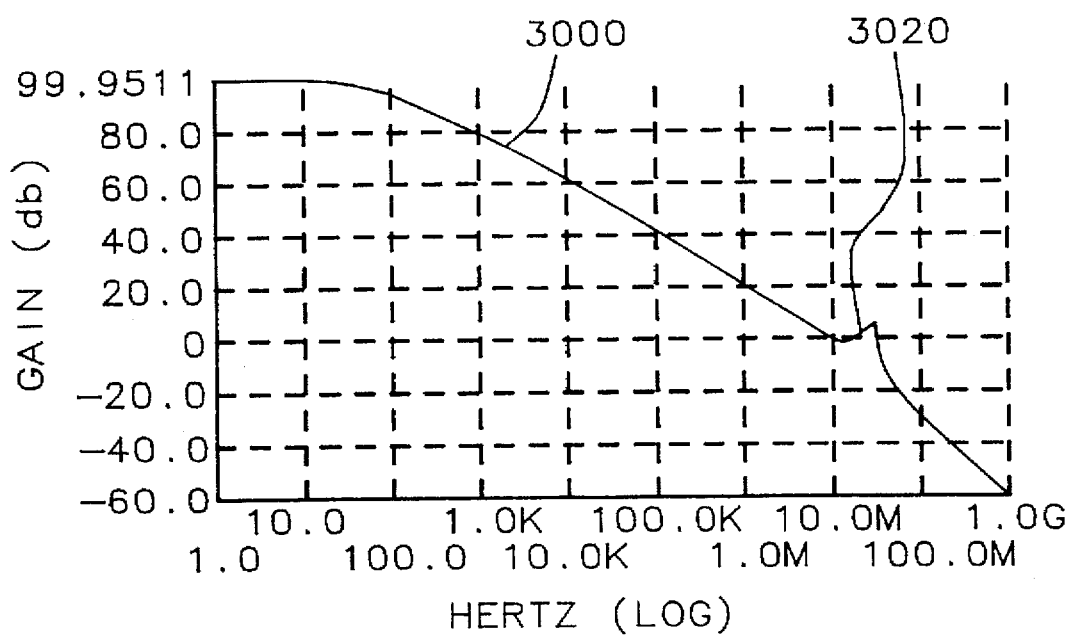
FIGS. 5a and 5b are plots of the gain and the phase margin of an operational amplifier with a single MOSFET capacitor as frequency compensation.
Figure 5B:
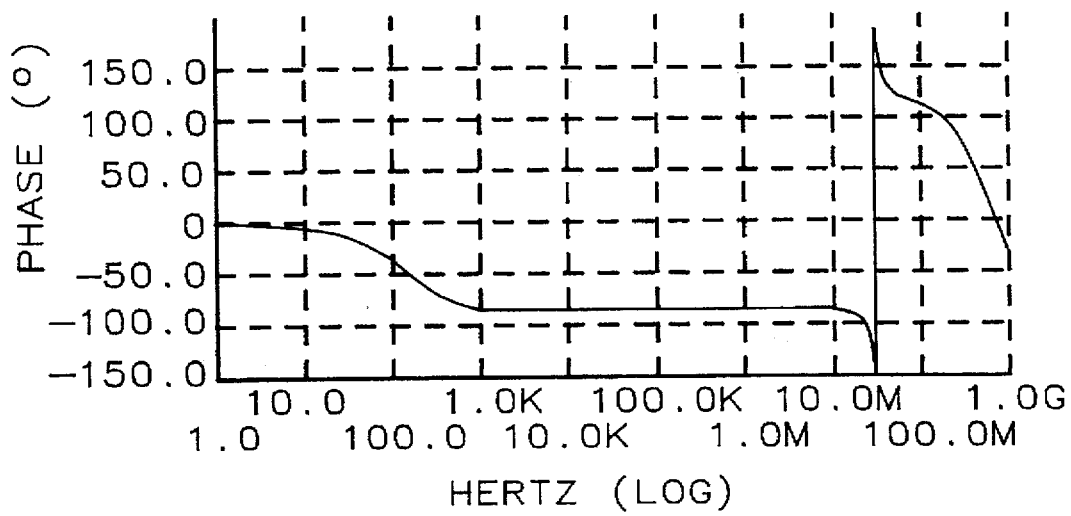

Referring to FIG. 2, the differential amplifier stage 100 is composed of pMOSFET's M1A, M1B, and M2. The pMOSFET's M1A and M1B have their sources connected together and to the drain of M2 to form a differential pair of transistors. The pMOSFET M2 is configured as a current source with voltage bias $V_{b1}$ establishing the magnitude of current in pMOSFET M2. The noninverting input 50 is connected to the gate of pMOSFET M1B and the inverting 55 is connected to the gate of pMOSFET M1A.

The folded cascode amplifier is composed of the transistors MPD12, MP4A, MP4B, MP5A, MP5B, MP6A, MP6B, MP7A, MP7B, and MPD13.

The drain to source voltage of transistors M7A, M7B, M4A, and M4B are biased with the minimum voltage required to keep these transistors just in the saturation region of operation. Vb4 is adjusted to a voltage that is sufficient to keep the drain to source voltage across M4A and M4B to be the drain to source saturation voltage (Vdsat)+0.15V which is roughly equal to 0.85V. Vb2 is adjusted to a voltage that is sufficient to keep the drain to source voltage across M7A and M7B to be the Vdsat+0.15V which is roughly equal to 0.85V. This ensures that the voltage across the MOSCAPS 600 and 700 is sufficiently large approximately 1 volt. In order to keep the MOSCAPS 600 and 700 in the cut off region there must be at least a voltage of 0.4V across the MOSCAPS 600 and 700. Therefore, the maximum voltage that at the output which does not cause the MOSCAP 600 and 700 capacitance to vary is approximately ±0.6V, for a peak to peak voltage of the amplifier of 1.2V.

The output of the folded cascode amplifier stage 200 is connected to the linear amplifier stage 400. The nMOSFET M11 is biased to operate in the linear region of operation while the pMOSFET M9 is operating as an active load. The voltage of the output 450 will be set near the midpoint between the power supply voltage $V_{dd}$ and the ground reference potential. The output 450 will have a signal that is an exact replica of the input from the folded cascode amplifier stage 200 multiplied by a gain factor of from 40 to 100.

To provide frequency compensation, capacitor MCC1 600 is placed from the output 450 of the linear amplifier stage 400 to the virtual ground 800 that is a very low impedance point within the folded cascode amplifier stage 200, and the capacitor MCC2 700 is placed from the output 450 to an other virtual ground 900.

The unity gain bandwidth of the operational amplifier is given by:

$$\frac{gm_{M1A}}{C_c}$$

where $gm_{M1A}$ is the transconductance of MOSFET M1A $C_c$ is the capacitance of MCC1 600 and MCC2 700.

Figure 6A:
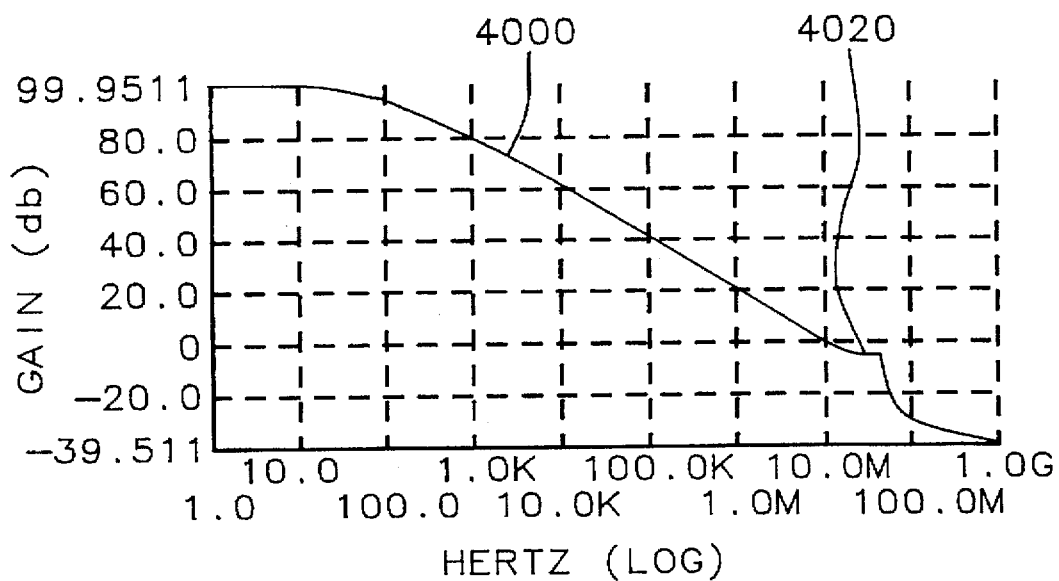
FIGS. 6a and 6b are plots of the gain and the phase margin of an operational amplifier with frequency compensation of this invention.
Figure 6B:
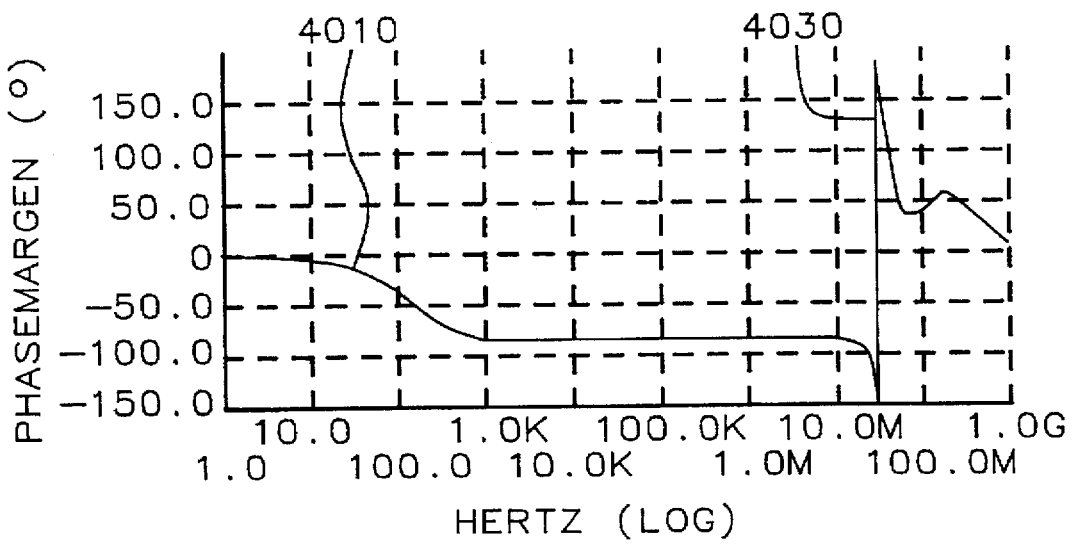

FIGS. 6a and 6b are the plots of the gain 4000 and the phase margin 4010. The gain at the point 4020 and the phase margin 4030 change dramatically. However, the gain remains negative and is not sufficient to stimulate or sustain oscillation.

While the invention has been particularly shown and described with reference to the preferred embodiments thereof, it will be understood by those skilled in the art that various changes in form and details may be made without departing from the spirit and scope of the invention.

What is claimed is:

1. A folded cascode operational amplifier with MOS Capacitor frequency compensation to provide stability for said folded cascode operational amplifier over a large range of input frequencies while minimizing distortion of an output signal and occupying minimal space on an integrated circuit, comprising:

a) a differential amplifier stage having an inverting input, a noninverting input, an inverting output, and a non-inverting output;
   b) a folded cascode amplifier stage having an inverted input, a noninverted input, and an output;
   c) a linear amplifier stage having an input and an output;
   d) a power distribution and biasing network means to provide a power supply voltage source, a ground reference potential, a substrate voltage source, and a plurality of biasing voltage sources to said differential amplifier stage, said folded cascode amplifier stage, and said linear amplifier stage: and
   e) a first frequency compensation capacitor coupled from the noninverting input of the folded cascode stage and the output of the linear amplifier stage; and
   f) a second frequency compensation capacitor coupled from the noninverting input of the folded cascode stage and the output of the linear amplifier stage to a first virtual ground within the folded cascade amplifier stage.

2. The amplifier of claim 1 wherein the first frequency compensation capacitor further comprises a first MOSFET having a gate coupled to the output of the linear amplifier stage and a drain, source, and bulk connected to the noninverted input of folded cascode amplifier which is a second internal virtual ground.

3. The amplifier of claim 1 wherein the second frequency compensation capacitor comprises a second MOSFET having a gate connected to the output of said linear amplifier stage and a drain, source, and bulk connected to first virtual ground within said linear amplifier stage.

4. The amplifier of claim 1 wherein the inverting output of the differential stage is connected to the inverted input of the folded cascode amplifier stage and the noninverting output of said differential stage is connected to the noninverted input of the folded cascode amplifier stage.

5. The amplifier of claim 1 wherein the output of the folded cascode amplifier stage is connected to the input of the linear amplifier stage.

6. The amplifier of claim 1 wherein the output of the linear amplifier stage is coupled to external circuitry.

7. The amplifier of claim 1 wherein the plurality biasing voltage sources from the power distribution and biasing network to the folded cascode amplifier is adjusted such that the voltage from the gate to the bulk of the first MOSFET that is the first compensation capacitor is biased such that said MOSFET is in the cutoff region of operation.

8. The amplifier of claim 1 wherein the plurality of biasing voltage sources from the power distribution and biasing network to the folded cascode amplifier stage are adjusted such that the second MOSFET that is the second frequency capacitor is biased such that said second MOSFET is in the cutoff region of operation.

9. The amplifier of claim 1 wherein the first and second frequency compensation capacitor occupy an area of an integrated circuit of 20 to 50 times less than a conventional metal polycrystalline silicon frequency compensation capacitors.

* * * * *